(12) United States Patent
Sasaki et al.

(10) Patent No.: US 10,902,987 B2
(45) Date of Patent: Jan. 26, 2021

(54) SPIN-ORBIT TORQUE TYPE MAGNETIZATION ROTATION ELEMENT, SPIN-ORBIT TORQUE MAGNETORESISTANCE EFFECT ELEMENT, AND METHOD OF MANUFACTURING SPIN-ORBIT TORQUE TYPE MAGNETIZATION ROTATION ELEMENT

(71) Applicant: TDK CORPORATION, Tokyo (JP)

(72) Inventors: Tomoyuki Sasaki, Tokyo (JP); Yohei Shiokawa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 15 days.

(21) Appl. No.: 16/227,850

(22) Filed: Dec. 20, 2018

(65) Prior Publication Data
US 2019/0206603 A1 Jul. 4, 2019

(30) Foreign Application Priority Data

Dec. 28, 2017 (JP) .................... 2017-252906
Oct. 30, 2018 (JP) .................... 2018-204507

(51) Int. Cl.
| | | |
|---|---|---|
| *G11C 11/00* | (2006.01) | |
| *H01F 10/32* | (2006.01) | |
| *G11C 11/16* | (2006.01) | |
| *H01L 43/14* | (2006.01) | |
| *H01L 43/04* | (2006.01) | |

(Continued)

(52) U.S. Cl.
CPC ........ *H01F 10/3286* (2013.01); *G11C 11/161* (2013.01); *G11C 11/18* (2013.01); *H01L 43/04* (2013.01); *H01L 43/06* (2013.01); *H01L 43/08* (2013.01); *H01L 43/10* (2013.01); *H01L 43/12* (2013.01); *H01L 43/14* (2013.01)

(58) Field of Classification Search
CPC ......... G11C 11/16; G11C 11/15; H01L 43/08; H01L 27/228
USPC .................................................. 365/158, 171
See application file for complete search history.

(56) References Cited

U.S. PATENT DOCUMENTS

| | | |
|---|---|---|
| 8,350,347 B2 | 1/2013 | Gaudin et al. |
| 2014/0056060 A1 | 2/2014 | Khvalkovskiy et al. |

(Continued)

FOREIGN PATENT DOCUMENTS

| | | |
|---|---|---|
| JP | 2014-045196 A | 3/2014 |
| WO | 2016/021468 A1 | 2/2016 |
| WO | 2016/159017 A1 | 10/2016 |

OTHER PUBLICATIONS

Y.K.Kato et al., "Observation of the Spin Hall Effect in Semiconductors;" Science, 306, 1910 (2004).

(Continued)

*Primary Examiner* — Son T Dinh
(74) *Attorney, Agent, or Firm* — Oliff PLC

(57) ABSTRACT

The spin-orbit torque magnetization rotational element includes a spin-orbit torque wiring layer which extends in an X direction and a first ferromagnetic layer which is laminated on the spin-orbit torque wiring layer. The first ferromagnetic layer has shape anisotropy and has a major axis in the X direction. An easy axis of magnetization of the first ferromagnetic layer is inclined with respect to the X direction and a Y direction orthogonal to the X direction on a plane in which the spin-orbit torque wiring layer extends.

20 Claims, 6 Drawing Sheets

(51) Int. Cl.
*G11C 11/18* (2006.01)
*H01L 43/10* (2006.01)
*H01L 43/12* (2006.01)
*H01L 43/06* (2006.01)
*H01L 43/08* (2006.01)

(56) References Cited

U.S. PATENT DOCUMENTS

| | | | |
|---|---|---|---|
| 2015/0036415 A1 | 2/2015 | Di Pendina et al. | |
| 2015/0041934 A1* | 2/2015 | Khvalkovskiy | H01L 43/02 257/421 |
| 2015/0348606 A1 | 12/2015 | Buhrman et al. | |
| 2017/0222135 A1* | 8/2017 | Fukami | H01L 43/08 |
| 2017/0346149 A1* | 11/2017 | Ciubotaru | H01L 43/10 |

OTHER PUBLICATIONS

I.M. Miron et al., "Perpendicular switching of a single ferromagnetic layer induced by in-plane current injection;" Nature, 476, 189 (2011).

L. Liu et al., "Spin torque switching with the giant spin Hall effect of tantalum;" Science, 336, 555 (2012).

L. Liu et al., "Current-Induced Switching of Perpendicularly Magnetized Magnetic Layers Using Spin Torque from the Spin Hall Effect;" Physical Review Letters, 109, 096602 (2012).

KS. Lee et al., "Threshold current for switching of a perpendicular magnetic layer induced by spin Hall effect;" Applied Physics Letters, 102, 112410 (2013).

KS. Lee et al., "Thermally activated switching of perpendicular magnet by spin-orbit spin torque;" Applied Physics Letters, 104, 072413 (2014).

S. Fukami et al., "Magnetization switching by spin-orbit torque in an antiferromagnet-ferromagnet bilayer system;" nature materials, 15, 535, (2016).

S. Fukami et al., "A spin-orbit torque switching scheme with collinear magnetic easy axis and current configuration;" nature nanotechnology, 11, 621 (2016).

S. Takahashi et al., "Spin injection and detection in magnetic nanostructures;" Physical Review B 67, 052409 (2003).

Y. Seo et al., "Area-Efficient SOT-MRAM With a Schottky Diode;" IEEE Electron Device Letters, vol. 37, No. 8, p. 982 (2016).

W. Zhang et al., "Spin Hall Effects in Metallic Antiferromagnets;" Physical Review Letters, 113, 196602 (2014).

* cited by examiner

SPIN-ORBIT TORQUE TYPE MAGNETIZATION ROTATION ELEMENT, SPIN-ORBIT TORQUE MAGNETORESISTANCE EFFECT ELEMENT, AND METHOD OF MANUFACTURING SPIN-ORBIT TORQUE TYPE MAGNETIZATION ROTATION ELEMENT

BACKGROUND OF THE DISCLOSURE

Field of the Disclosure

The present disclosure relates to a spin-orbit torque magnetization rotational element, a spin-orbit torque magnetoresistance effect element, and a method of manufacturing a spin-orbit torque magnetization rotational element.

Priority is claimed on Japanese Patent Application No. 2017-252906, filed on Dec. 28, 2017, and Japanese Patent Application No. 2018-204507, filed on Oct. 30, 2018, the contents of which is incorporated herein by reference.

Description of Related Art

In a tunneling magnetoresistance (TMR) element using an insulating layer (a tunnel barrier layer, a barrier layer) as a non-magnetic layer, a writing (magnetization rotation) method using a magnetic field formed by a current or a writing (magnetization rotation) method using a spin transfer torque (STT) which is generated by causing a current to flow in a stacking direction of a magnetoresistance effect element is known. Magnetization rotation of a TMR element using an STT is efficient in view of energy efficiency, but a current has to be applied in the stacking direction of the magnetoresistance effect element to cause magnetization rotation and thus there is concern that the TMR element may deteriorate.

Recently, a spin-orbit torque magnetization rotational element using a pure spin current which is generated due to a spin-orbit interaction as means for enabling magnetization rotation without causing a current to flow in the stacking direction of a magnetoresistance effect element has attracted attention. When a current flows in a spin-orbit torque wiring layer, a pure spin current is generated due to a spin-orbit interaction or a Rashba effect at an interface between different materials. This pure spin current induces a spin-orbit torque (SOT) and causes magnetization rotation in a ferromagnetic material disposed on the spin-orbit torque wiring layer due to the SOT. A pure spin current is generated by causing the same number of electrons with an upward spin and the same number of electrons with a downward spin to flow in opposite directions, and flows of electric charges cancel each other out. Accordingly, a rotation current flowing in a magnetoresistance effect element is zero and extension of a life span of a magnetoresistance effect element can be expected. In a spin-orbit torque magnetization rotational element, magnetization rotation is more easily caused as a current density flowing in a spin-orbit torque wiring layer becomes greater.

Spin-orbit torque type magnetization rotation elements are classified into several types depending on a relationship between a direction of a current flowing in a spin-orbit torque wiring layer and a direction of an easy axis of magnetization of a ferromagnetic material. A spin-orbit torque magnetization rotational element includes a spin-orbit torque wiring layer which extends in an X direction and a first ferromagnetic layer which is laminated on one surface thereof. Depending on the direction of the easy axis of magnetization of the first ferromagnetic layer, spin-orbit torque magnetization rotational elements are classified into X-type, Y-type, and Z-type magnetization rotation elements. An X-type magnetization rotation element has an easy axis of magnetization in the same X direction as the spin-orbit torque wiring layer. A Y-type magnetization rotation element has an easy axis of magnetization in a Y direction orthogonal to the X direction in an in-plane direction. A Z-type magnetization rotation element has an easy axis of magnetization in a Z direction (the stacking direction) which is orthogonal to the in-plane direction. The X-type and the Z-type magnetization rotation elements require a short time for magnetization rotation and can operate at a high speed. In the X-type magnetization rotation element, since the spin-orbit torque wiring layer has a major axis in the X direction, a width in the Y direction can be decreased. Accordingly, in the X-type magnetization rotation element, magnetization rotation is possible with a current smaller than that in the Y-type magnetization rotation element. However, in the X-type and Z-type magnetization rotation elements, external magnetic fields in the Z direction and the X direction have to be applied to the elements to assist magnetization rotation. Accordingly, the X-type and Z-type magnetization rotation elements have a problem in energy consumption or a degree of integration. On the other hand, in the Y-type magnetization rotation element, an external magnetic field for assisting magnetization rotation is not necessary, but a long time for magnetization rotation is required and a width in the Y direction is large. Accordingly, there is a problem in that a current required for magnetization rotation is high.

In order to solve this problem, an XY-type magnetization rotation element in which an easy axis of magnetization of a first ferromagnetic layer is inclined to the X direction and the Y direction has been proposed (for example, see S. Fukami, et al., Nature Nanotechnology, DOI: 10.1038/NNANO. 2016.29 Supplement). FIG. 11 illustrates such an XY-type magnetization rotation element 501. The XY-type magnetization rotation element 501 includes a spin-orbit torque wiring layer 502, a first ferromagnetic layer 504, and electrodes 506. The first ferromagnetic layer 504 and the electrodes 506 are stacked on one surface of the spin-orbit torque wiring layer 502, and the electrodes 506 are disposed such that the first ferromagnetic layer 504 is interposed therebetween in a plan view. Unlike the spin-orbit torque wiring layer 502 having a major axis in the X direction, the first ferromagnetic layer 504 has a major axis which is inclined with respect to the X direction and the Y direction in a plan view. An easy axis of magnetization 508 of the first ferromagnetic layer 504 is oriented in a direction parallel to the major axis of the first ferromagnetic layer 504 due to shape anisotropy.

In the XY-type magnetization rotation element 501 having this configuration, since the easy axis of magnetization has a Y-direction component, magnetization rotation is caused without application of an external magnetic field thereto. Since the easy axis of magnetization has an X-direction component, a time required for magnetization rotation is shorter than that in a Y-type magnetization rotation element, which is suitable for a high-speed operation.

SUMMARY OF THE DISCLOSURE

However, in the XY-type magnetization rotation element illustrated in FIG. 11, since the major axis of the first ferromagnetic layer is inclined with respect to the X direction and the Y direction, the width in the Y direction of the spin-orbit torque wiring layer increases. Accordingly, there is a problem in that a current density flowing in the spin-orbit torque wiring layer decreases and a current required for magnetization rotation increases.

The disclosure is made in consideration of the above-mentioned problems and an objective thereof is to provide a spin-orbit torque magnetization rotational element, a spin-orbit torque magnetoresistance effect element, and a method of manufacturing a spin-orbit torque magnetization rotational element that can cause magnetization rotation without causing a large current to flow in a spin-orbit torque wiring layer and without applying an external magnetic field thereto.

The inventors of the disclosure found that a width of a spin-orbit torque wiring layer can be decreased and magnetization rotation can be easily caused without causing a large current to flow in a spin-orbit torque wiring layer and without applying an external magnetic field thereto, by aligning a major axis of a first ferromagnetic layer with a major axis of the spin-orbit torque wiring layer and inclining only an easy axis of magnetization of the first ferromagnetic layer with respect to the major axis of the spin-orbit torque wiring layer. That is, the disclosure provides the following means to achieve the above-mentioned objective.

(1) According to a first aspect, there is provided a spin-orbit torque magnetization rotational element including: a spin-orbit torque wiring layer which extends in an X direction; and a first ferromagnetic layer which is laminated on the spin-orbit torque wiring layer, wherein the first ferromagnetic layer has shape anisotropy and has a major axis in the X direction, and an easy axis of magnetization of the first ferromagnetic layer is inclined with respect to the X direction and a Y direction orthogonal to the X direction on a plane in which the spin-orbit torque wiring layer extends.

(2) In the spin-orbit torque magnetization rotational element according to this aspect, the first ferromagnetic layer may be an HoCo alloy, an SmFe alloy, an FePt alloy, a CoPt alloy, or a CoCrPt alloy.

(3) According to a second aspect, there is provided a spin-orbit torque magnetoresistance effect element including: the spin-orbit torque magnetization rotational element according to the first aspect; a second ferromagnetic layer which is disposed on a side of the first ferromagnetic layer opposite to a side with the spin-orbit torque wiring layer, a magnetization direction of the second ferromagnetic layer being fixed; and a non-magnetic layer which is disposed between the first ferromagnetic layer and the second ferromagnetic layer.

(4) The spin-orbit torque magnetoresistance effect element according to the second aspect may further include a third ferromagnetic layer which is disposed between the first ferromagnetic layer and the non-magnetic layer.

(5) In the spin-orbit torque magnetoresistance effect element according to the second aspect, the first ferromagnetic layer may include a diffusion prevention layer on a surface on a side with the non-magnetic layer on the first ferromagnetic layer.

(6) In the spin-orbit torque magnetoresistance effect element according to the second aspect, the diffusion prevention layer may include a nonmagnetic heavy metal.

(7) In the spin-orbit torque magnetoresistance effect element according to the second aspect, the diffusion prevention layer may have a thickness of twice or less an ionic radius an ionic radius of an element constituting the diffusion prevention layer.

(8) According to a third aspect, there is provided a method of manufacturing the spin-orbit torque magnetization rotational element according to the first aspect, the method including forming at least the first ferromagnetic layer while applying a magnetic field in a direction including the Y direction.

(9) The method of manufacturing the spin-orbit torque magnetization rotational element according to the third aspect may further include the step of annealing the first ferromagnetic layer while applying a magnetic field in a direction including the Y direction after forming at least the first ferromagnetic layer.

(10) According to a fourth aspect, there is provided a method of manufacturing the spin-orbit torque magnetization rotational element according to the first aspect, the method including the step of annealing the first ferromagnetic layer while applying a magnetic field thereto in a direction including the Y direction after forming at least the first ferromagnetic layer.

The spin-orbit torque magnetization rotational element according to the aspects can cause magnetization rotation without causing a large current to flow in a spin-orbit torque wiring layer and without applying an external magnetic field thereto.

DETAILED DESCRIPTION OF THE DISCLOSURE

Figure 1:
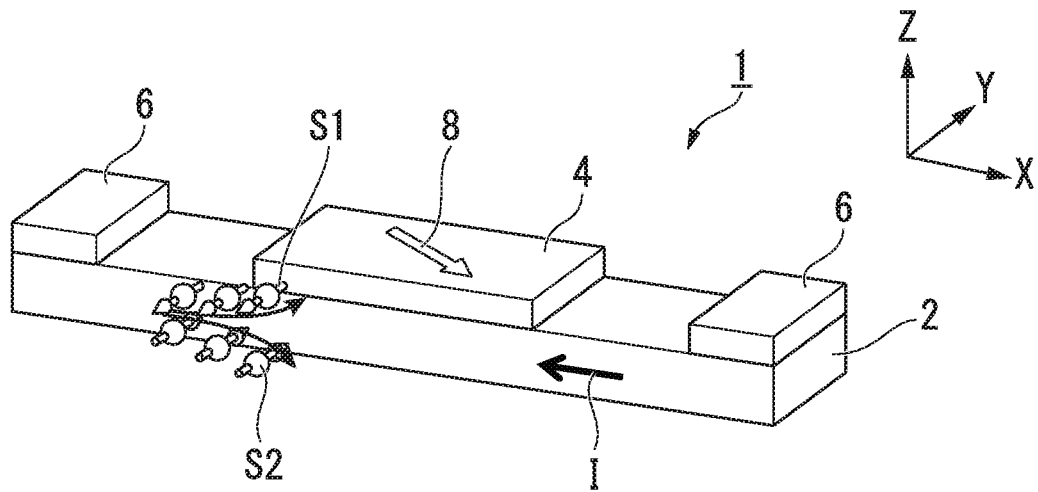
FIG. 1 is a perspective view schematically illustrating a spin-orbit torque magnetization rotational element according to an embodiment of the disclosure.

Hereinafter, the disclosure will be described in detail with reference to the accompanying drawings. In the drawings used for the following description, feature parts may be enlarged for the purpose of convenience and dimensional proportions of elements or the like may be different from actual values. Materials, dimensions, and the like which are described in the following description are examples, and the disclosure is not limited thereto and can be appropriately modified as long as advantageous effects of the disclosure are achieved.

(Spin-Orbit Torque Type Magnetization Rotation Element)

Figure 2:
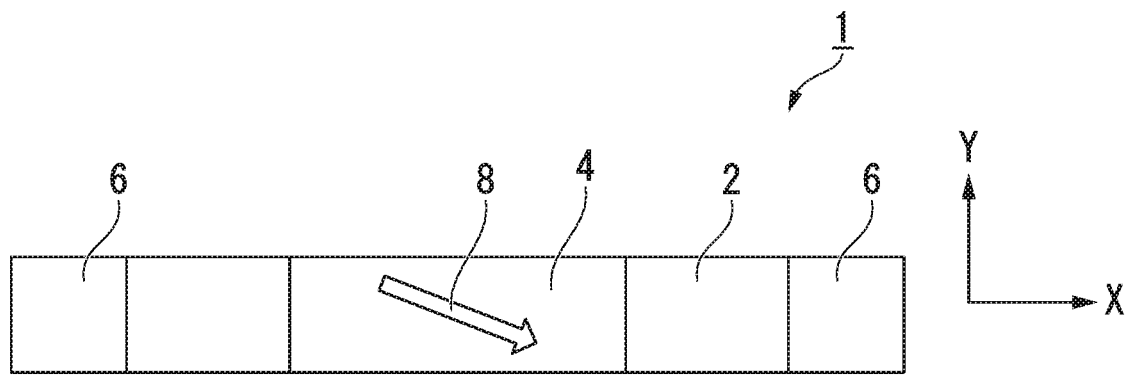
FIG. 2 is a plan view schematically illustrating the spin-orbit torque magnetization rotational element illustrated in FIG. 1.

FIG. 1 is a perspective view schematically illustrating a spin-orbit torque magnetization rotational element 1 according to an embodiment of the disclosure. FIG. 2 is a plan view schematically illustrating the spin-orbit torque magnetization rotational element 1 illustrated in FIG. 1. The spin-orbit torque magnetization rotational element 1 according to the embodiment of the disclosure includes a spin-orbit torque wiring layer 2, a first ferromagnetic layer 4 that is stacked and arranged on the spin-orbit torque wiring layer 2, and electrodes 6 that are stacked and arranged on the spin-orbit torque wiring layer 2 while interposing the first ferromagnetic layer 4 therebetween. In the following description, a direction in which a major axis of the spin-orbit torque wiring layer 2 extends is defined as an X direction, a direction which is orthogonal to the X direction on a plane in which the spin-orbit torque wiring layer 2 extends is defined as a Y direction, and a direction which is orthogonal to both the X direction and the Y direction is defined as a Z direction. In FIG. 1, a stacking direction of the first ferromagnetic layer 4 is the Z direction. The first ferromagnetic layer 4 has shape anisotropy in which a major axis thereof extends in the X direction. The first ferromagnetic layer 4 has a magnetization 8 along an easy axis of magnetization which is inclined with respect to the X direction and the Y direction.

<Spin-Orbit Torque Wiring Layer>

The spin-orbit torque wiring layer 2 extends in the X direction. The spin-orbit torque wiring layer 2 is connected to one surface of the first ferromagnetic layer 4 in the Z direction. The spin-orbit torque wiring layer 2 may be directly connected to the first ferromagnetic layer 4 or may be connected thereto with another layer interposed therebetween.

It is preferable that a layer interposed between the spin-orbit torque wiring layer 2 and the first ferromagnetic layer 4 do not scatter spins propagating from the spin-orbit torque wiring layer 2. For example, it is known that silver, copper, magnesium, and aluminum have a long spin diffusion length of 100 nm or more and do not easily scatter spins.

A thickness of the layer is preferably equal to or less than a spin diffusion length of a material constituting the layer. When the thickness of the layer is equal to or less than the spin diffusion length, the layer can satisfactorily transfer spins propagating from the spin-orbit torque wiring layer 2 to the first ferromagnetic layer 4.

The spin-orbit torque wiring layer 2 is formed of a material in which a spin current is generated due to a spin Hall effect when a current flows therein. Such a material has only to have a configuration in which a spin current is generated in the spin-orbit torque wiring layer 2. Accordingly, the spin-orbit torque wiring layer 2 is not limited to a material including a single element, and may include a part formed of a material in which a spin current is generated and a part formed of a material in which a spin current is not generated.

A phenomenon in which the first spin S1 and the second spin S2 are turned in opposite directions which are orthogonal to a direction of a current on the basis of a spin-orbit interaction and a spin current is caused when a current flows in a material is called a spin Hall effect. A normal Hall effect and a spin Hall effect are the same in that moving (migrating) electric charges (electrons) turn their moving (migrating) directions. On the other hand, charged particles moving in a magnetic field can turn their moving directions with a Lorentz force in the normal Hall effect, but charged particles can turn their moving directions by only electrons being caused to move (a current being caused to flow) without a magnetic field in the spin Hall effect, and thus both Hall effects are greatly different from each other.

In a nonmagnetic material (a material other than a ferromagnetic material), since the number of electrons with the first spin S1 and the number of electrons with the second spin S2 are the same, the number of electrons with the first spin S1 which is oriented toward a surface of the spin-orbit torque wiring layer 2 on which the first ferromagnetic layer 4 is disposed and the number of electrons with the second spin S2 which is oriented in a reserve direction to the direction of electrons with the first spin S1 are the same. Accordingly, a current which is a pure flow of electric charges is zero. A spin current not accompanied with a current is particularly referred to as a pure spin current.

Here, when an electron flow with the first spin S1 is defined as $J_\uparrow$, an electron flow with the second spin S2 is defined as $J_\downarrow$, and a spin current is defined as $J_S$, the spin current $J_S$ is defined as $J_S = J_\uparrow - J_\downarrow$. In FIG. 1, the spin current $J_S$ flows upward as a pure spin current in the drawing. Here, the spin current $J_S$ is a flow of electrons with a polarizability of 100%.

The spin-orbit torque wiring layer 2 may include a nonmagnetic heavy metal. Here, a heavy metal is used with a meaning of a metal having a specific weight equal to or greater than that of yttrium. The spin-orbit torque wiring layer 2 may include only a nonmagnetic heavy metal.

In this case, it is preferable that the nonmagnetic heavy metal be a nonmagnetic heavy metal having d electrons or f electrons in the outermost shell thereof and having a large atomic number of 39 or greater. Such a nonmagnetic heavy metal has a large spin-orbit interaction that causes the spin Hall effect. The spin-orbit torque wiring layer 2 may be only a ferromagnetic metal layer having d electrons or f electrons in the outermost shell thereof and having a large atomic number of 39 or greater.

In general, when a current flows in a metal, all electrons therein move in the opposite direction to the current regardless of spin directions thereof. On the other hand, since a nonmagnetic heavy metal having d electrons or f electrons in the outermost shell thereof and having a large atomic number has a large spin-orbit interaction, a direction in which electrons moves due to the spin Hall effect depends on the spin directions of the electrons and a pure spin current $J_S$ is easily generated.

The spin-orbit torque wiring layer 2 may include a magnetic metal. A magnetic metal refers to a ferromagnetic metal or an antiferromagnetic metal. When a small amount of magnetic metal is included in a nonmagnetic metal, the spin-orbit interaction is enhanced and a spin current generation efficiency for a current flowing in the spin-orbit torque wiring layer 2 is increased. The spin-orbit torque wiring layer 2 may be only an antiferromagnetic metal.

The spin-orbit interaction is caused by an internal magnetic field specific to the material of the spin orbit torque wiring and thus a pure spin current is also generated in a nonmagnetic material. When a small amount of magnetic metal is added to the material of the spin orbit torque wiring, the magnetic metal scatters electrons flowing therein and thus the spin current generation efficiency is enhanced. However, when the amount of magnetic metal added thereto is excessively large, the generated spin current is scattered by the added magnetic metal and thus an action of decreasing the spin current is enhanced. Accordingly, it is preferable that a mole ratio of the added magnetic metal be much smaller than a mole ratio of a major component of a spin generating part in the spin-orbit torque wiring. As a guide, it is preferable that the mole ratio of the magnetic metal added thereto be equal to or less than 3%.

The spin-orbit torque wiring layer 2 may include a topological insulator. The spin-orbit torque wiring layer 2 may be only a topological insulator. A topological insulator is a material which includes an insulator or a high-resistance material therein and in which a spin-polarized metallic state is formed on the surface thereof. In this material, an internal magnetic field or the like such as a spin-orbit interaction is generated. Therefore, a new topological phase appears due to an effect of the spin-orbit interaction without an external magnetic field. This is a topological insulator, which can generate a pure spin current due to a strong spin-orbit interaction and breakdown of inversion symmetry at an edge with a high efficiency.

For example, SnTe, $Bi_{1.5}Sb_{0.5}Te_{1.7}Se_{1.3}$, $TlBiSe_2$, $Bi_2Te_3$, $Bi_{1-x}Sb_x$, or $(Bi_{1-x}Sb_x)_2Te_3$ can be preferably used for the topological insulator. This topological insulator can generate a spin current with a high efficiency.

<First Ferromagnetic Layer>

The first ferromagnetic layer 4 is stacked and arranged on the spin-orbit torque wiring layer 2 in the Z direction which is orthogonal to the X direction. The first ferromagnetic layer 4 has shape anisotropy in which the major axis thereof extends in the X direction. The first ferromagnetic layer 4 has a magnetization 8 having an easy axis of magnetization in a direction inclined with respect to the X direction and the Y direction on a plane in which the spin-orbit torque wiring layer 2 extends. It is preferable that the first ferromagnetic layer 4 include, for example, an HoCo alloy, an SmFe alloy, an FePt alloy, a CoPt alloy, or a CoCrPt alloy. A tetragonal magnetic material in which a c-axis length is smaller than an a-axis length is preferably used as a material of the first ferromagnetic layer 4. When the c-axis length is smaller than the a-axis length, the easy axis of magnetization of the first ferromagnetic layer 4 can be easily oriented in an in-plane direction. For example, an Sm-Fe alloy ($SmFe_{12}$) is preferably used. When the c-axis length is larger than the a-axis length, the easy axis of magnetization of the first ferromagnetic layer 4 can be easily oriented in the in-plane direction, but the c axis can be directed in a magnetic field direction in the plane by performing film formation in a magnetic field or performing annealing in a magnetic field. For example, an Ho—Co alloy ($HoCo_2$) can be preferably used. Since such an alloy has strong magnetocrystalline anisotropy and has a large damping constant, magnetization rotation is not readily caused. Accordingly, the first ferromagnetic layer 4 which is formed of such materials has a strong data storing ability.

The major-axis direction of the first ferromagnetic layer 4 and the direction of the easy axis of magnetization of the first ferromagnetic layer 4 may be different from each other. In this case, the direction of the easy axis of magnetization of the magnetization 114 of the first ferromagnetic layer 4 can be acquired, for example, using the following methods.

In a first method, a plurality of first ferromagnetic layers 4 which are manufactured in the same conditions are positioned and magnetic characteristics thereof are measured. The magnetic characteristics can be measured using a vibrating sample magnetometer (VSM), a superconducting quantum interference device (SQUID), or a physical property measuring system (PPMS), or the like.

First, a plurality of first ferromagnetic layers 4 in which a major axis is disposed in one direction are arranged in an array form. Then, a constant magnetic field is applied to an element assembly of the first ferromagnetic layers 4 in a predetermined direction (a reference direction) in an xy plane and magnetizations of the first ferromagnetic layers 4 in the predetermined direction are measured. Since a plurality of first ferromagnetic layers 4 are disposed, the element assembly exhibits a measureable magnetization. The magnetization is measured at a plurality of points around the in-plane direction of the element assembly while changing an angle at which the magnetic field is applied.

When the magnitude of the magnetization in the predetermined direction is plotted on the vertical axis and an inclination angle of the magnetic field applied to the element assembly with respect to the reference direction is plotted on the horizontal axis, magnetization characteristics of the element assembly are acquired. When each first ferromagnetic layer 4 has an isotropic shape in the xy plane (for example, a circular shape in a plan view), the measured magnetization characteristics describe a sinusoidal curve. When each first ferromagnetic layer 4 has a major axis in one direction and the direction of the easy axis of magnetization of the first ferromagnetic layer 4 and the major axis direction of the first ferromagnetic layer 4 are parallel to each other, the shape of the sinusoidal curve (an inclination angle at each point in the graph) changes but the inclination angle indicating a maximum magnetization is the same as in the isotropic shape. On the other hand, when each first ferromagnetic layer 4 has a major axis in one direction and the direction of the easy axis of magnetization of the first ferromagnetic layer 4 and the major axis direction of the first ferromagnetic layer 4 are different from each other, the shape of the sinusoidal curve (an inclination angle at each point in the graph) changes and the inclination angle indicating a maximum magnetization is shifted. That is, when an inclination angle with respect to the reference direction at a position at which the magnetization has a peak in the graph and an inclination angle of the major axis direction of the first ferromagnetic layer 4 with respect to the reference direction are different from each other, it can be seen that the major axis direction of the first ferromagnetic layer 4 and the direction of the easy axis of magnetization of the first ferromagnetic layer 4 are different from each other.

A second method is a method of measuring a resistance value of the spin-orbit torque magnetization rotational element 1 while applying a magnetic field to the spin-orbit torque magnetization rotational element 1. The resistance value of the spin-orbit torque magnetization rotational element 1 is measured while changing an angle at which a constant magnetic field is applied in the predetermined direction (the reference direction) in the xy plane. The resistance value of the spin-orbit torque magnetization rotational element 1 is a resistance value between the top surface of the first ferromagnetic layer 4 and one end of the spin-orbit torque wiring layer 2 and is mainly the resistance value of the first ferromagnetic layer 4.

When the resistance value of the spin-orbit torque magnetization rotational element 1 is plotted on the vertical axis and an inclination angle of the magnetic field applied to the first ferromagnetic layer 4 with respect to the reference direction is plotted on the horizontal axis, resistance characteristics of the spin-orbit torque magnetization rotational element 1 are acquired. The resistance characteristics exhibit the same behavior as the magnetization characteristics. When the first ferromagnetic layer 4 has an isotropic shape in the xy plane (for example, a circular shape in a plan view), the measured resistance characteristics describe a sinusoidal curve. When each first ferromagnetic layer 4 has a major axis in one direction and the direction of the easy axis of magnetization of the first ferromagnetic layer 4 and the major axis direction of the first ferromagnetic layer 4 are parallel to each other, the shape of the sinusoidal curve (an inclination angle at each point in the graph) changes but the inclination angle indicating a maximum resistance value is the same as in the isotropic shape. On the other hand, when each first ferromagnetic layer 4 has a major axis in one direction and the direction of the easy axis of magnetization of the first ferromagnetic layer 4 and the major axis direction of the first ferromagnetic layer 4 are different from each other, the shape of the sinusoidal curve (an inclination angle at each point in the graph) changes and the inclination angle indicating a maximum magnetization is shifted. That is, when an inclination angle with respect to the reference direction at a position at which the resistance value has a peak in the graph and an inclination angle of the major axis direction of the first ferromagnetic layer 4 with respect to the reference direction are different from each other, it can be seen that the major axis direction of the first ferromagnetic layer 4 and the direction of the easy axis of magnetization of the first ferromagnetic layer 4 are different from each other.

<Principle of Spin-Orbit Torque Magnetization Rotational Element>

The principle of the spin-orbit torque magnetization rotational element 1 will be described below with reference to FIGS. 1 and 2.

As illustrated in FIG. 1, when a current I is applied to the spin-orbit torque wiring layer 2, the first spin S1 and the second spin S2 are turned due to the spin Hall effect. As a result a pure spin current $J_S$ is generated in the Z direction.

In FIG. 1, since the first ferromagnetic layer 4 is stacked and arranged on the spin-orbit torque wiring layer in the Z direction, a pure spin current diffuses and flows into the first ferromagnetic layer 4. That is, spins are injected into the first ferromagnetic layer 4. The injected spins give a spin-orbit torque (SOT) to the magnetization 8 of the first ferromagnetic layer 4 to cause magnetization rotation. In FIGS. 1 and 2, the magnetization 8 of the first ferromagnetic layer 4 is schematically illustrated as one magnetization which is located at the center of gravity of the first ferromagnetic layer 4.

Figure 11:
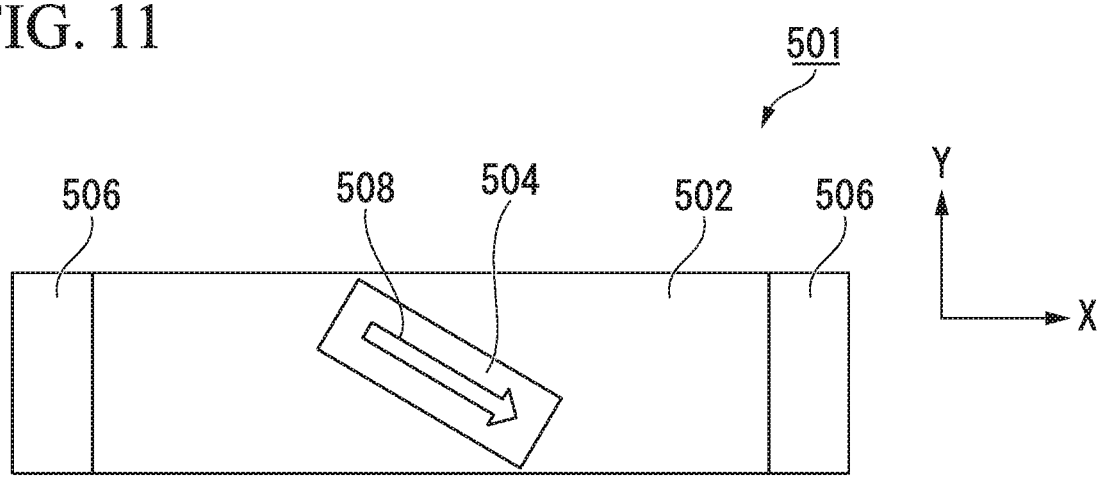
FIG. 11 is a plan view schematically illustrating a spin-orbit torque magnetization rotational element according to the related art.

When the directions of the spins injected into the ferromagnetic layer are orthogonal to the direction of the magnetization, it is necessary to disturb symmetry of the magnetization by applying an external magnetic field in order to cause magnetization rotation. However, in the spin-orbit torque magnetization rotational element 1 illustrated in FIG. 1, the directions of the spins injected into the first ferromagnetic layer 4 from the spin-orbit torque wiring layer 2 are arranged in the Y direction, but the direction of the magnetization 8 of the first ferromagnetic layer 4 is inclined with respect to both the X direction and the Y direction and thus the magnetization 8 has an X-direction component and a Y-direction component. Accordingly, since the magnetization 8 has a Y-direction component which is not orthogonal to the directions of the spins, magnetization rotation can be implemented without applying an external magnetic field thereto. When it is not necessary to apply an external magnetic field, it is possible to reduce energy consumption and to enhance a degree of integration of elements. Since the magnetization 8 has an X-direction component, a time required for magnetization rotation can be decreased in the spin-orbit torque magnetization rotational element 1 illustrated in FIG. 1 unlike in a case in which the magnetization 8 extends in the Y direction, which is suitable for a high-speed operation. Unlike the XY-type magnetization rotation element according to the related art illustrated in FIG. 11, since the major axis of the first ferromagnetic layer 4 is disposed in the X direction, it is possible to decrease a width in the Y direction of the spin-orbit torque wiring layer 2. As a result, it is possible to implement an XY-type magnetization rotation element without decreasing a current density, that is, without increasing a current.

(Method of Manufacturing Spin-Orbit Torque Magnetization Rotational Element)

Figure 3:
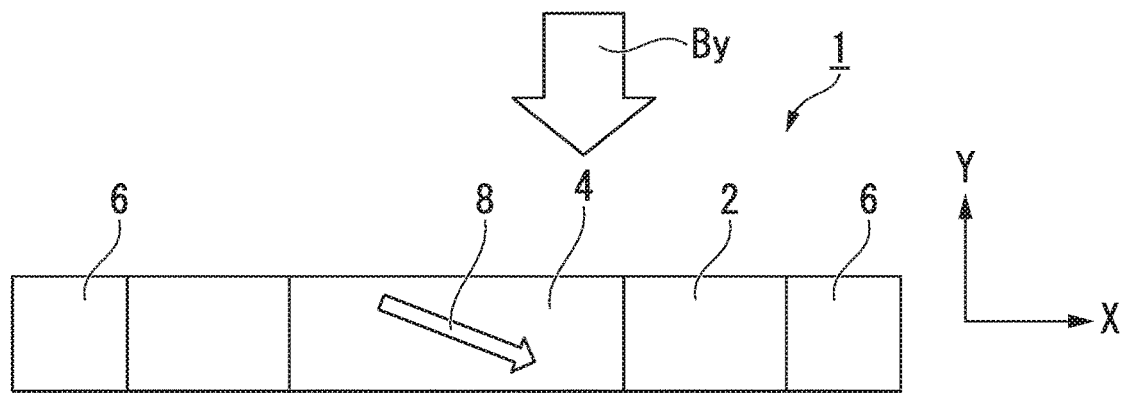
FIG. 3 is a plan view schematically illustrating a method of manufacturing a spin-orbit torque magnetization rotational element according to an embodiment of the disclosure.

FIG. 3 is a plan view schematically illustrating a method of a spin-orbit torque magnetization rotational element according to an embodiment of the disclosure. First, a spin-orbit torque wiring layer 2 is formed on a substrate which serves as a support member. The spin-orbit torque wiring layer 2 can be formed using known film forming means such as sputtering.

Subsequently, a first ferromagnetic layer 4 is formed. The first ferromagnetic layer 4 can be formed using known film forming means such as sputtering. However, when the first ferromagnetic layer 4 is merely formed in a shape in which a major axis thereof is parallel to the X direction, the easy axis of magnetization extends in the X direction due to shape anisotropy and thus an XY-type magnetization rotation element cannot be implemented. Therefore, as illustrated in FIG. 3, the first ferromagnetic layer 4 is formed while externally applying a magnetic field $B_y$ having a Y-direction component. Then, the easy axis of magnetization of the first ferromagnetic layer 4 is inclined with respect to both the X direction and the Y direction due to the shape anisotropy and an action of the magnetic field $B_y$.

Even when a magnetic field $B_y$ is not applied at the time of formation of the first ferromagnetic layer 4 and the first ferromagnetic layer 4 is annealed at a predetermined temperature, for example, at a temperature of 250° C. to 400° C., while applying the magnetic field $B_y$ having a Y-direction component after the first ferromagnetic layer 4 has been formed, an easy axis of magnetization which is inclined with respect to both the X direction and the Y direction is acquired. A magnetic field $B_y$ having a Y-direction component may be applied at the time of formation of the first ferromagnetic layer 4 and the first ferromagnetic layer 4 may be annealed at a predetermined temperature, for example, at a temperature of 250° C. to 400° C., while applying the magnetic field $B_y$ having a Y-direction component after the first ferromagnetic layer 4 has been formed.

(Spin-Orbit Torque Magnetoresistance Effect Element According to First Embodiment)

Figure 4:
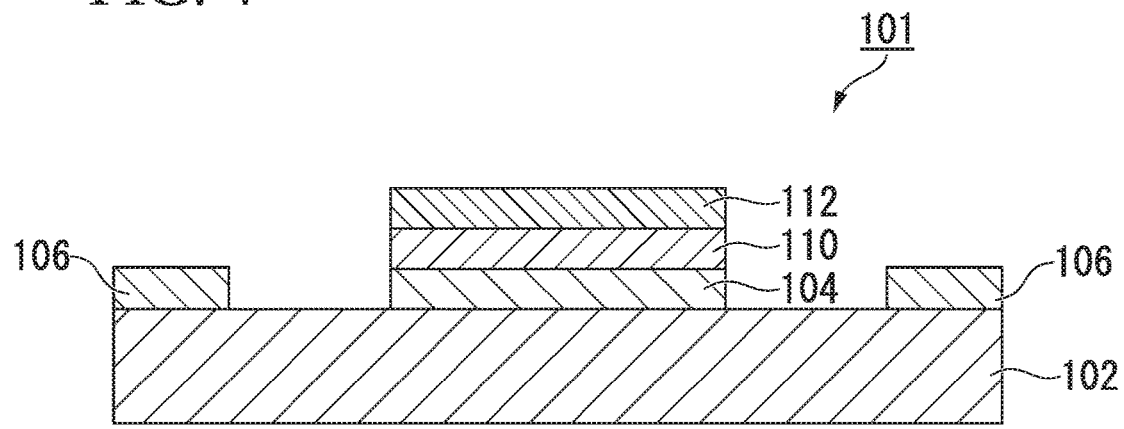
FIG. 4 is a sectional view schematically illustrating a spin-orbit torque magnetoresistance effect element according to an embodiment of the disclosure.
Figure 5:
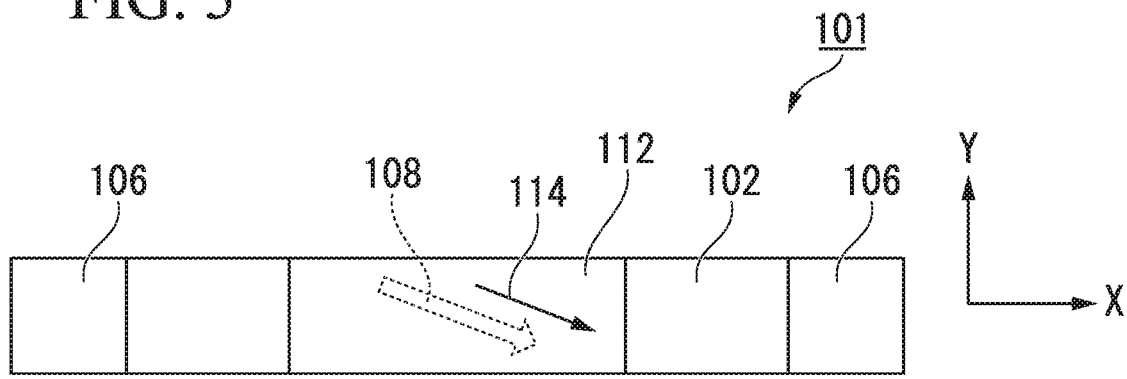
FIG. 5 is a plan view schematically illustrating the spin-orbit torque magnetoresistance effect element illustrated in FIG. 4.
Figure 6:
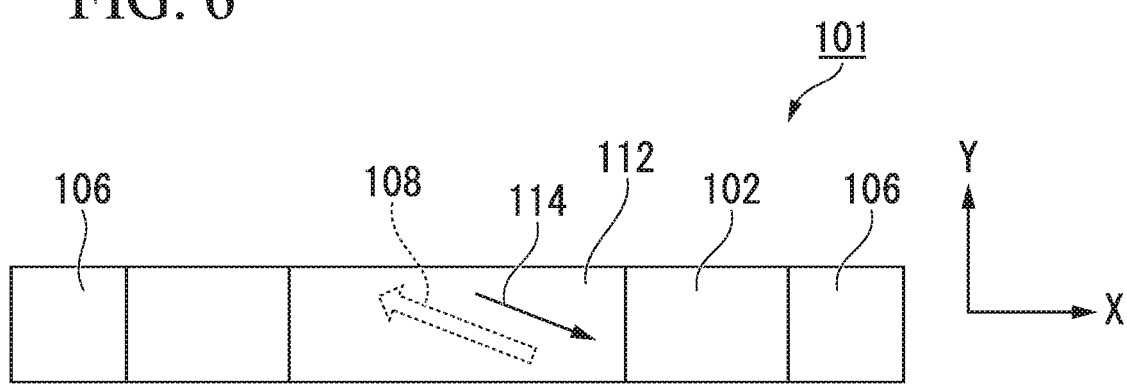
FIG. 6 is a plan view schematically illustrating a state in which a magnetization is rotated in the spin-orbit torque magnetoresistance effect element illustrated in FIG. 4.

FIG. 4 is a sectional view schematically illustrating a spin-orbit torque magnetoresistance effect element 101 according to a first embodiment of the disclosure. FIG. 5 is a plan view schematically illustrating the spin-orbit torque magnetoresistance effect element 101 illustrated in FIG. 4. FIG. 6 is a plan view schematically illustrating the spin-orbit torque magnetoresistance effect element 101 illustrated in FIG. 4 in a state in which a magnetization has rotated.

The spin-orbit torque magnetoresistance effect element 101 includes a spin-orbit torque magnetization rotational element including a spin-orbit torque wiring layer 102 that has a major axis extending in the X direction and a first ferromagnetic layer 104 that is stacked and arranged on the spin-orbit torque wiring layer 102 in the Z direction which is orthogonal to the X direction, a second ferromagnetic layer 112 that is disposed on a side of the first ferromagnetic layer 104 opposite to a side with the spin-orbit torque wiring layer 102 and has a magnetization of which the direction is fixed, and a non-magnetic layer 110 that is disposed between the first ferromagnetic layer 104 and the second ferromagnetic layer 112. The configuration of the spin-orbit torque magnetization rotational element is the same as the configuration of the spin-orbit torque magnetization rotational element 1 which has described above with reference to FIGS. 1 and 2 and detailed description thereof will not be repeated.

<Second Ferromagnetic Layer>

The spin-orbit torque magnetoresistance effect element 101 functions by causing the magnetization of the second ferromagnetic layer 112 to be fixed to one direction and causing the magnetization direction of the first ferromagnetic layer 104 to change relatively. When the spin-orbit torque magnetoresistance effect element 101 is applied to a coercivity-differed type (a pseudo spin valve type) MRAM, a coercivity of the second ferromagnetic layer 112 is set to be larger than a coercivity of the first ferromagnetic layer 104. When the spin-orbit torque magnetoresistance effect element 101 is applied to an exchange bias type (a spin valve type) MRAM, the magnetization direction of the second ferromagnetic layer 112 is fixed due to exchange coupling with an antiferromagnetic layer.

The spin-orbit torque magnetoresistance effect element 101 serves as a tunneling magnetoresistance (TMR) element when the non-magnetic layer 110 is formed of an insulator, and serves as a giant magnetoresistance (GMR) element when the non-magnetic layer 110 is formed of a metal.

A known stacked structure of a spin-orbit torque magnetoresistance effect element can be employed as a stacked structure of the spin-orbit torque magnetoresistance effect element 101. For example, each layer may include a plurality of layers or may include another layer such as an antiferromagnetic layer for fixing the magnetization direction of the second ferromagnetic layer 112. The second ferromagnetic layer 112 is referred to as a fixed layer or a reference layer, and the first ferromagnetic layer 104 is referred to as a free layer or a memory layer.

The second ferromagnetic layer 112 has a major axis parallel to the X direction. The direction of a magnetization 114 thereof can have various directions, and may be, for example, a direction parallel to the easy axis of magnetization (a direction parallel to the magnetization 108) of the first ferromagnetic layer 104 as illustrated in FIG. 5 or may be a direction parallel to the X direction.

Any known material can be used as the material of the second ferromagnetic layer 112, and the same material as the first ferromagnetic layer 104 can be used. Since the first ferromagnetic layer 104 is an in-plane magnetization film, it is preferable that the second ferromagnetic layer 112 be also an in-plane magnetization film.

In order to further increase the coercivity of the second ferromagnetic layer 112 in comparison with the first ferromagnetic layer 104, an antiferromagnetic material such as IrMn or PtMn may be used as the material in contact with the second ferromagnetic layer 112. In order to prevent a leaking magnetic field from the second ferromagnetic layer 112 from affecting the first ferromagnetic layer 104, the second ferromagnetic layer 112 may have a synthetic ferromagnetic coupling structure.

<Non-Magnetic Layer>

Known materials can be used for the non-magnetic layer 110. For example, when the non-magnetic layer 70 is formed of an insulator (when the non-magnetic layer 110 is a tunnel barrier layer), $Al_2O_3$, $SiO_2$, MgO, $MgAl_2O_4$, and the like can be used as the material thereof. In addition, materials in which some of Al, Si, or Mg is replaced with Zn, Be, or the like can be used as the material thereof. Among these materials, MgO and $MgAl_2O_4$ are materials capable of realizing coherent tunneling and thus can efficiently inject spins. When the non-magnetic layer 110 is formed of a metal, Cu, Au, Ag, or the like can be used as the material thereof. When the non-magnetic layer 110 is formed of a semiconductor, Si, Ge, $CuInSe_2$, $CuGaSe_2$, $Cu(In, Ga)Se_2$, or the like can be used as the material thereof.

The spin-orbit torque magnetoresistance effect element 101 may include another layer. For example, the spin-orbit torque magnetoresistance effect element 101 may include a base layer on the surface of the first ferromagnetic layer 104 opposite to the non-magnetic layer 110 or may include a cap layer on the surface of the second ferromagnetic layer 112 opposite to the non-magnetic layer 110.

(Principle of Spin-Orbit Torque Magnetoresistance Effect Element)

The principle of the spin-orbit torque magnetoresistance effect element 101 will be described below.

FIG. 5 is a plan view of the spin-orbit torque magnetoresistance effect element 101 including the second ferromagnetic layer 112 of which a magnetization 114 is parallel to the magnetization 108. The magnetization 108 of the first ferromagnetic layer 104 is inclined with respect to both the X direction and the Y direction, and the direction of the magnetization 108 is a direction which is parallel to the magnetization 114 of the second ferromagnetic layer 112 in FIG. 5. In this case, electric resistance between the first ferromagnetic layer 104 and the second ferromagnetic layer 112 is in a low-resistance state.

FIG. 6 illustrates a state in which the magnetization 108 of the first ferromagnetic layer 104 is reversed in the opposite direction in FIG. 5 and is a plan view of the spin-orbit torque magnetoresistance effect element 101. As described above in the principle of a spin-orbit torque magnetization rotational element, when spins are injected into the first ferromagnetic layer 104 from the spin-orbit torque wiring layer 102, the magnetization 108 is rotated and reversed. Then, the magnetization 108 is parallel to the magnetization 114 of the second ferromagnetic layer 112 and is opposite thereto in direction (antiparallel). In this case, the electric resistance between the first ferromagnetic layer 104 and the second ferromagnetic layer 112 is in a high-resistance state. Accordingly, the spin-orbit torque magnetoresistance effect element 101 serves as a magnetic memory that stores data of 0/1 corresponding to the electric resistance state between the first ferromagnetic layer 104 and the second ferromagnetic layer 112 depending on whether the directions of the magnetization 108 and the magnetization 114 are parallel or antiparallel.

An example in which the magnetization 114 of the second ferromagnetic layer 112 is inclined with respect to the X direction and the Y direction has been described herein. In this case, the magnetization 108 of the first ferromagnetic layer 104 and the magnetization 114 of the second ferromagnetic layer 112 are perfectly parallel or perfectly antiparallel. That is, it is possible to further enhance an MR ratio of the spin-orbit torque magnetoresistance effect element 101. However, the magnetization 114 of the second ferromagnetic layer 112 may be parallel to the X direction based on the shape anisotropy of the second ferromagnetic layer 112. In this case, the X-direction component of the magnetization 108 of the first ferromagnetic layer 104 can has a state in which it is parallel or antiparallel to the magnetization 114 of the second ferromagnetic layer 112 and thus the spin-orbit torque magnetoresistance effect element can serve as a magnetic memory.

(Spin-Orbit Torque Magnetoresistance Effect Element According to Second Embodiment)

Figure 7:
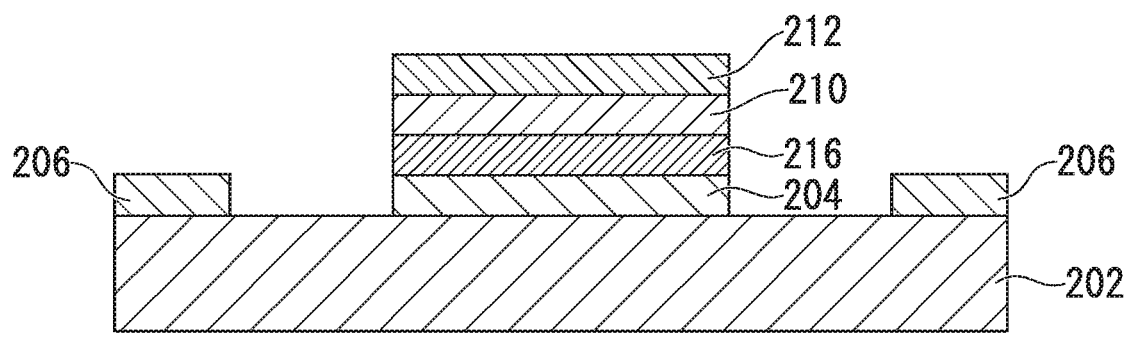
FIG. 7 is a sectional view schematically illustrating a spin-orbit torque magnetoresistance effect element according to an embodiment of the disclosure.

FIG. 7 is a sectional view schematically illustrating a spin-orbit torque magnetoresistance effect element 201 according to a second embodiment of the disclosure. In the spin-orbit torque magnetoresistance effect element 201, a first ferromagnetic layer 204 may include a diffusion prevention layer 216. The diffusion prevention layer 216 may be disposed on the surface of the first ferromagnetic layer 204 on a non-magnetic layer 210 side, or may be disposed in a part in the thickness direction of the first ferromagnetic layer 204. In the latter, the first ferromagnetic layer has a three-layer structure of a lower layer, a diffusion prevention layer, and an upper layer. The other structure is the same as in the spin-orbit torque magnetoresistance effect element 101 according to the first embodiment and thus detailed description thereof will not be repeated.

<Diffusion Prevention Layer>

A nonmagnetic heavy metal can be used as the material of the diffusion prevention layer 216. For example, when annealing is performed in the same way as in a case in which the first ferromagnetic layer 204 having a magnetization which is inclined with respect to both the X direction and the Y direction is implemented, diffusion of elements from the inside of the first ferromagnetic layer 204 to a second ferromagnetic layer 212 is caused and magnetic characteristics can be deteriorated. However, when the diffusion prevention layer 216 is disposed in the first ferromagnetic layer 204, diffusion of elements from the inside of the first ferromagnetic layer 204 to the second ferromagnetic layer 212 can be prevented even when annealing has been performed at a high temperature after the first ferromagnetic layer and the second ferromagnetic layer have been formed, and the magnetic characteristics are not deteriorated.

The diffusion prevention layer 216 may include a nonmagnetic heavy metal. Since a heavy metal has low mobility even under annealing, diffusion of an element between the first ferromagnetic layer 204 and the second ferromagnetic layer 212 is prevented even when annealing has been performed at a high temperature after the first ferromagnetic layer and the second ferromagnetic layer have been formed. As a result, it is possible to curb deterioration of the magnetic characteristics of the first ferromagnetic layer 204 and the second ferromagnetic layer 212.

The diffusion prevention layer 216 can have a thickness which is equal to or less than two times an ionic radius of a constituent element. With this thickness, a heavy metal element is dotted in an island shape, and a mixed layer of the upper layer or the lower layer and the heavy metal element serves as the diffusion prevention layer.

(Spin-Orbit Torque Magnetoresistance Effect Element According to Third Embodiment)

Figure 8:
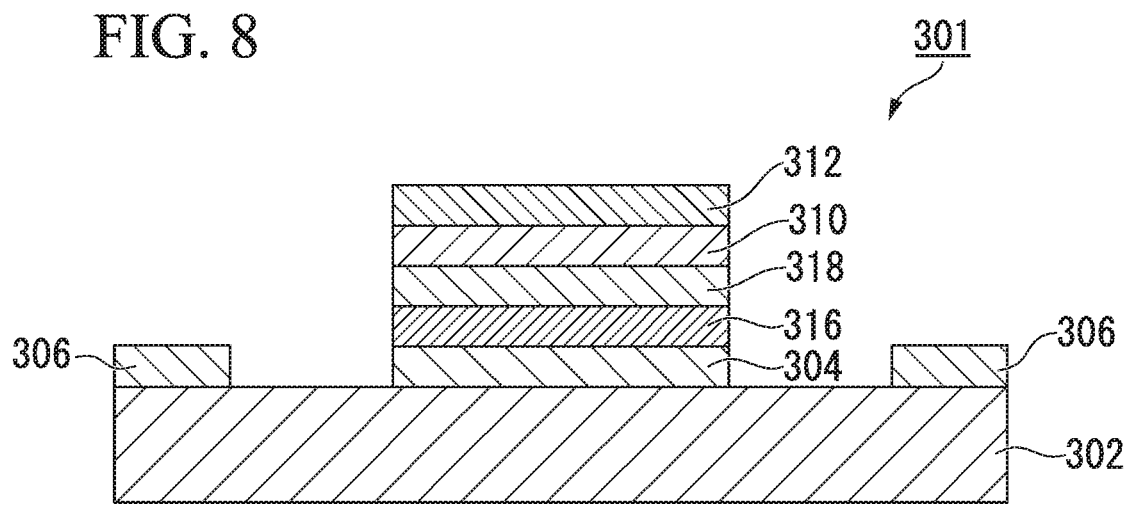
FIG. 8 is a sectional view schematically illustrating a spin-orbit torque magnetoresistance effect element according to an embodiment of the disclosure.
Figure 9:
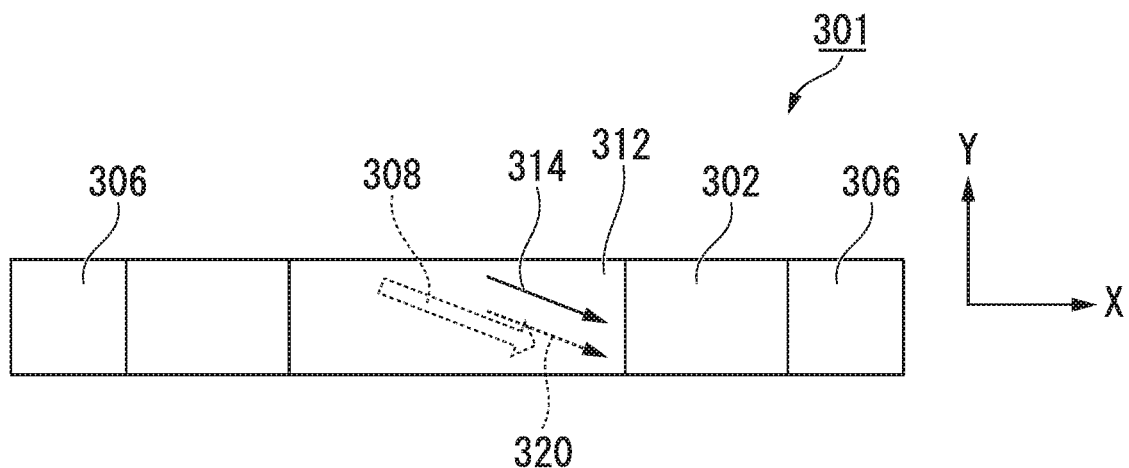
FIG. 9 is a plan view schematically illustrating the spin-orbit torque magnetoresistance effect element illustrated in FIG. 8.

FIG. 8 is a sectional view schematically illustrating a spin-orbit torque magnetoresistance effect element 301 according to a third embodiment of the disclosure. FIG. 9 is a plan view schematically illustrating the spin-orbit torque magnetoresistance effect element 301 illustrated in FIG. 8. The spin-orbit torque magnetoresistance effect element 301 includes a third ferromagnetic layer 318 that is disposed between a first ferromagnetic layer 304 and a non-magnetic layer 310. The other structure is the same as the spin-orbit torque magnetoresistance effect element 201 according to the second embodiment and thus detailed description thereof will not be repeated. In FIG. 8, the first ferromagnetic layer 304 includes a diffusion prevention layer 316, but the diffusion prevention layer 316 may be omitted.

CoFeB, CoB, or FeB can be used as the material of the third ferromagnetic layer 318. The third ferromagnetic layer 318 has a magnetization 320 in a direction parallel to a magnetization 308 of the first ferromagnetic layer 304. When the third ferromagnetic layer 318 is disposed between the first ferromagnetic layer 304 and the non-magnetic layer 310, the first ferromagnetic layer 304 and the third ferromagnetic layer 318 are magnetically coupled to each other and can rotate as one magnetization. Accordingly, by disposing the third ferromagnetic layer 318, it is possible to enhance the magnetoresistance effect.

(Magnetic Recording Array According to Fourth Embodiment)

Figure 10:
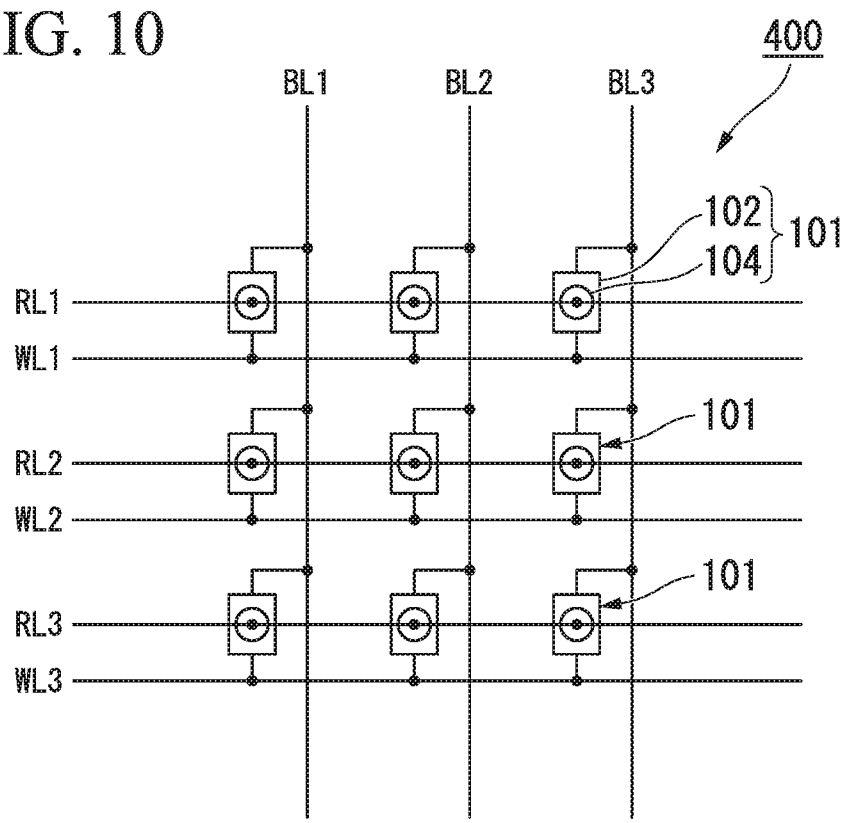
FIG. 10 is a plan view of a magnetic memory array according to a fourth embodiment.

FIG. 10 is a plan view of a magnetic recording array 400 according to a fourth embodiment. The magnetic recording array 400 illustrated in FIG. 10 has a configuration in which spin-orbit torque magnetoresistance effect elements 101 are arranged in a 3×3 matrix. FIG. 10 illustrates an example of the magnetic recording array and the type, the number, and the arrangement of the spin-orbit torque magnetoresistance effect elements 101 are arbitrary. A control portion may be provided over all the spin-orbit torque magnetoresistance effect elements 101 or may be provided for each spin-orbit torque magnetoresistance effect element 101.

Each spin-orbit torque magnetoresistance effect element 101 is connected to one of word lines WL1 to WL3, one of bit lines BL1 to BL3, and one of reading lines RL1 to RL3.

By selecting one of the word lines WL1 to WL3 and one of the bit lines BL1 to BL3 to which a current is applied, a pulse current is caused to flow into the first ferromagnetic layer 104 of a spin-orbit torque magnetoresistance effect element 101 to perform a writing operation. By selecting one of the reading lines RL1 to RL3 and one of the bit lines BL1 to BL3 to which a current is applied, a current is caused to flow in the stacking direction of a spin-orbit torque magnetoresistance effect element 101 to perform a reading operation. The word lines WL1 to WL3, the bit lines BL1 to BL3, and the reading lines RL1 to RL3 to which a current is applied can be selected using transistors or the like. Since each spin-orbit torque magnetoresistance effect element 101 records information in multi-values, it is possible to achieve an increase in capacity of the magnetic recording array.

While exemplary embodiments of the disclosure have been described above in detail, the disclosure is not limited to any specific embodiment and can be modified and changed in various forms without departing from the gist of the disclosure described in the appended claims.

Figure 12:
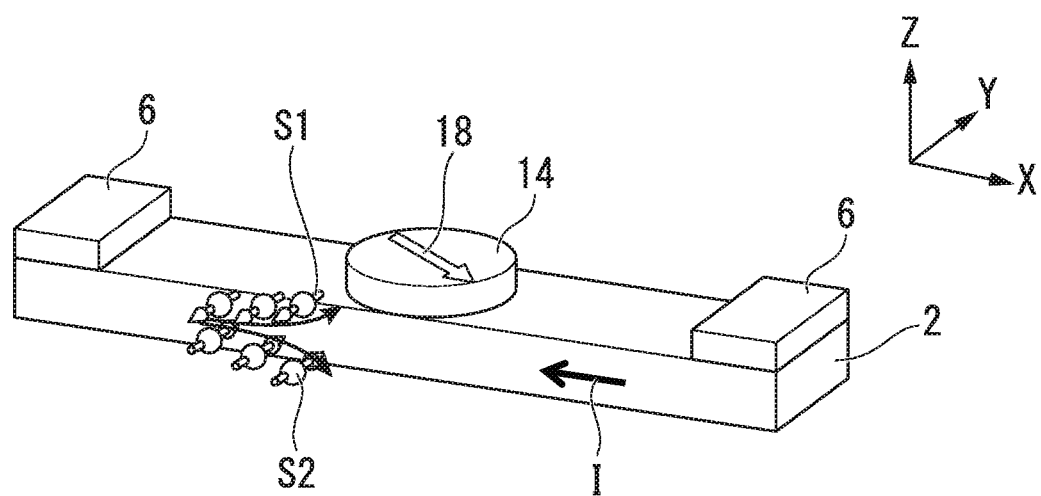
FIG. 12 is a perspective view schematically illustrating another example of the spin-orbit torque magnetization rotational element.

Here, a spin-orbit torque magnetization rotational element illustrated in FIG. 12 has a circular first ferromagnetic layer 14 in a plan view in the Z direction. Since the shape in a plan view is circular, there is no shape anisotropy.

However, the direction of a magnetization 18 of the first ferromagnetic layer 14 is inclined with respect to both the X direction and the Y direction and includes an X-direction component and a Y-direction component. Accordingly, since the magnetization 18 includes a Y-direction component which is not orthogonal to the direction of a spin, it is possible to implement magnetization rotation without applying an external magnetic field thereto with this configuration. The easy magnetization direction of the magnetization 18 can be freely set by applying a magnetic field at the time of film formation or annealing even when there is no shape anisotropy. Advantages with this configuration are not limited to the spin-orbit torque magnetization rotational element and are true of a spin-orbit torque magnetoresistance effect element.

While preferred embodiments of the disclosure have been described and illustrated above, it should be understood that these are exemplary of the disclosure and are not to be considered as limiting. Additions, omissions, substitutions, and other modifications can be made without departing from the spirit or scope of the present disclosure. Accordingly, the disclosure is not to be considered as being limited by the foregoing description, and is only limited by the scope of the appended claims.

EXPLANATION OF REFERENCES

1: Spin-orbit torque type magnetization rotation element
2, 102, 202, 302, 502: Spin-orbit torque wiring layer
4, 104, 204, 304, 504: First ferromagnetic layer
6, 106, 206, 306, 506: Electrode
108, 208, 308, 508: Easy axis of magnetization of first ferromagnetic layer
110, 210, 310: Non-magnetic layer
112, 212, 312: Second ferromagnetic layer
114, 314: Magnetization of second ferromagnetic layer
216, 316: Diffusion prevention layer
318: Third ferromagnetic layer
320: Magnetization of third ferromagnetic layer
S1: First spin
S2: Second spin
I: Current
$J_S$: Pure spin current

What is claimed is:

1. A spin-orbit torque magnetization rotational element comprising:
 a spin-orbit torque wiring layer which extends in an X direction; and
 a first ferromagnetic layer which is laminated on the spin-orbit torque wiring layer,
 wherein the first ferromagnetic layer has shape anisotropy and has a major axis in the X direction, and
 wherein an easy axis of magnetization of the first ferromagnetic layer is inclined with respect to the X direction and a Y direction orthogonal to the X direction on a plane in which the spin-orbit torque wiring layer extends.

2. The spin-orbit torque magnetization rotational element according to claim 1, wherein the first ferromagnetic layer is an HoCo alloy, an SmFe alloy, an FePt alloy, a CoPt alloy, or a CoCrPt alloy.

3. A spin-orbit torque magnetoresistance effect element comprising:
 the spin-orbit torque magnetization rotational element according to claim 1;
 a second ferromagnetic layer which is disposed on a side of the first ferromagnetic layer opposite to a side with the spin-orbit torque wiring layer, a magnetization direction of the second ferromagnetic layer being fixed; and
 a non-magnetic layer which is disposed between the first ferromagnetic layer and the second ferromagnetic layer.

4. A spin-orbit torque magnetoresistance effect element comprising:
 the spin-orbit torque magnetization rotational element according to claim 2;
 a second ferromagnetic layer which is disposed on a side of the first ferromagnetic layer opposite to a side with the spin-orbit torque wiring layer, a magnetization direction of the second ferromagnetic layer being fixed; and
 a non-magnetic layer which is disposed between the first ferromagnetic layer and the second ferromagnetic layer.

5. The spin-orbit torque magnetoresistance effect element according to claim 3, further comprising:
 a third ferromagnetic layer which is disposed between the first ferromagnetic layer and the non-magnetic layer.

6. The spin-orbit torque magnetoresistance effect element according to claim 4, further comprising:
 a third ferromagnetic layer which is disposed between the first ferromagnetic layer and the non-magnetic layer.

7. The spin-orbit torque magnetoresistance effect element according to claim 3,
 wherein the first ferromagnetic layer includes a diffusion prevention layer on a surface on a side with the non-magnetic layer on the first ferromagnetic layer.

8. The spin-orbit torque magnetoresistance effect element according to claim 4,
 wherein the first ferromagnetic layer includes a diffusion prevention layer on a surface on a side with the non-magnetic layer on the first ferromagnetic layer.

9. The spin-orbit torque magnetoresistance effect element according to claim 5,
 wherein the first ferromagnetic layer includes a diffusion prevention layer on a surface on a side with the non-magnetic layer on the first ferromagnetic layer.

10. The spin-orbit torque magnetoresistance effect element according to claim 6,
 wherein the first ferromagnetic layer includes a diffusion prevention layer on a surface on a side with the non-magnetic layer on the first ferromagnetic layer.

11. The spin-orbit torque magnetoresistance effect element according to claim 7,
 wherein the diffusion prevention layer contains a non-magnetic heavy metal.

12. The spin-orbit torque magnetoresistance effect element according to claim 8,
 wherein the diffusion prevention layer contains a non-magnetic heavy metal.

13. The spin-orbit torque magnetoresistance effect element according to claim 9,
 wherein the diffusion prevention layer contains a non-magnetic heavy metal.

14. The spin-orbit torque magnetoresistance effect element according to claim 10,
 wherein the diffusion prevention layer contains a non-magnetic heavy metal.

15. The spin-orbit torque magnetoresistance effect element according to claim 7,
 wherein the diffusion prevention layer has a thickness of twice or less an ionic radius of an element constituting the diffusion prevention layer.

16. A method of manufacturing the spin-orbit torque magnetization rotational element according to claim 1, comprising the step of:
 forming at least the first ferromagnetic layer while applying a magnetic field in a direction including the Y direction.

17. The method of manufacturing the spin-orbit torque magnetization rotational element according to claim 16, further comprising the step of:

annealing the first ferromagnetic layer while applying a magnetic field thereto in a direction including the Y direction after forming at least the first ferromagnetic layer.

18. A method of manufacturing the spin-orbit torque magnetization rotational element according to claim 1, comprising the step of:
annealing the first ferromagnetic layer while applying a magnetic field in a direction including the Y direction after forming at least the first ferromagnetic layer.

19. The spin-orbit torque magnetization rotational element according to claim 1, wherein a width of the spin-orbit torque wiring layer in the Y direction is equal to a width of the first ferromagnetic layer in the Y direction.

20. The spin-orbit torque magnetization rotational element according to claim 1, wherein the major axis of the first ferromagnetic layer extends in the X direction.

* * * * *